United States Patent
Lee (10) Patent No.: US 9,759,742 B2
(45) Date of Patent: Sep. 12, 2017

(54) TEST SOCKET INCLUDING CONDUCTIVE PARTICLES IN WHICH THROUGH-HOLES ARE FORMED AND METHOD FOR MANUFACTURING SAME

(71) Applicant: ISC CO., LTD., Seongnam-si, Gyeonggi-do (KR)

(72) Inventor: Jae Hak Lee, Seongnam-si (KR)

(73) Assignee: ISC CO., LTD., Seongnam-si, Gyeonggi-do (KR)

( * ) Notice: Subject to any disclaimer, the term of this patent is extended or adjusted under 35 U.S.C. 154(b) by 337 days.

(21) Appl. No.: 14/406,882

(22) PCT Filed: Jun. 18, 2013

(86) PCT No.: PCT/KR2013/005344
§ 371 (c)(1),
(2) Date: Dec. 10, 2014

(87) PCT Pub. No.: WO2013/191432
PCT Pub. Date: Dec. 27, 2013

(65) Prior Publication Data
US 2015/0153387 A1    Jun. 4, 2015

(30) Foreign Application Priority Data
Jun. 18, 2012 (KR) .................. 10-2012-0065229

(51) Int. Cl.
*G01R 1/04* (2006.01)
*H01R 13/24* (2006.01)
*G01R 1/073* (2006.01)

(52) U.S. Cl.
CPC ......... *G01R 1/0433* (2013.01); *G01R 1/0466* (2013.01); *G01R 1/0483* (2013.01);
(Continued)

(58) Field of Classification Search
CPC ... H01R 23/722; H01R 13/2414; H01R 9/096
(Continued)

(56) References Cited

U.S. PATENT DOCUMENTS

| 4,548,862 A | 10/1985 | Hartman |
| 5,527,591 A * | 6/1996 | Crotzer .................. H01H 1/06 428/209 |

(Continued)

FOREIGN PATENT DOCUMENTS

| CN | 85105901 A | 1/1987 |
| CN | 1768454 A | 5/2006 |

(Continued)

OTHER PUBLICATIONS

Office Action dated May 23, 2016 of the Chinese patent applicatino No. 201380032382.X which corresponds to the above-identified application.

(Continued)

*Primary Examiner* — Gary Paumen
(74) *Attorney, Agent, or Firm* — Harness, Dickey & Pierce, P.L.C.

(57) ABSTRACT

The present invention relates to a test socket that is disposed between a blood test device and a test apparatus to electrically connect a terminal of the blood test device and a pad of the test apparatus with each other. Conduction units that are arranged at positions corresponding to the terminal of the blood test device and show conductivity in a thickness direction have: conduction units that are arranged in such a manner that multiple conductive particles are arranged in the thickness direction in an elastic insulating material; and an insulating support unit that supports and insulates each of the conduction units. The conductive particles are provided with through-holes bored through one surface and another (Continued)

surface other than the one surface, and the through-holes are filled with the elastic insulating material.

9 Claims, 6 Drawing Sheets

(52) U.S. Cl.
CPC ...... *G01R 1/07378* (2013.01); *H01R 13/2414* (2013.01); *H01R 2201/20* (2013.01)

(58) Field of Classification Search
USPC ...................................................... 439/66, 91
See application file for complete search history.

(56) References Cited

U.S. PATENT DOCUMENTS

| | | | | |
|---|---|---|---|---|
| 5,624,268 | A * | 4/1997 | Maeda | H01L 23/49827 257/E23.067 |
| 6,489,790 | B1 | 12/2002 | An et al. | |
| 6,937,038 | B2 * | 8/2005 | Maruyama | G01R 1/06711 257/E23.067 |
| 7,038,477 | B2 * | 5/2006 | Maruyama | G01R 1/06711 257/E23.067 |
| 7,202,679 | B2 * | 4/2007 | Maruyama | G01R 1/06711 324/754.16 |
| 7,563,487 | B2 | 7/2009 | Masuda et al. | |
| 7,585,174 | B2 * | 9/2009 | Ju | H01R 13/2414 439/66 |
| 7,922,497 | B2 * | 4/2011 | Yamada | G01R 1/0735 439/66 |
| 8,124,885 | B2 | 2/2012 | Yamada et al. | |
| 8,403,681 | B2 * | 3/2013 | Chien | H01R 4/04 439/331 |
| 8,974,626 | B2 * | 3/2015 | Fujii | B32B 7/02 156/307.7 |
| 2001/0016435 | A1 * | 8/2001 | Fujimura | G01R 1/0483 439/66 |
| 2002/0127893 | A1 * | 9/2002 | Brodsky | B29C 45/0013 439/66 |
| 2004/0127071 | A1 * | 7/2004 | Weiss et al. | H01R 13/2414 439/66 |
| 2006/0119374 | A1 | 6/2006 | Maruyama et al. | |
| 2008/0064233 | A1 * | 3/2008 | Watanabe | C08G 18/0823 439/66 |
| 2009/0068857 | A1 * | 3/2009 | Keist | H01H 13/785 439/66 |
| 2012/0106111 | A1 | 5/2012 | Mazzochette et al. | |
| 2013/0330942 | A1 * | 12/2013 | Rathburn | H05K 3/4069 439/66 |

FOREIGN PATENT DOCUMENTS

| | | |
|---|---|---|
| CN | 101449426 | 6/2009 |
| JP | S62021289 | 1/1987 |
| JP | H09-320715 A | 12/1997 |
| JP | H11-176545 A | 7/1999 |
| JP | 2002005992 A | 1/2002 |
| JP | 200740952 A | 2/2007 |
| JP | 2009259415 A | 11/2009 |
| JP | 2011-150837 A | 8/2011 |
| JP | 2011150837 A | 8/2011 |
| KR | 10-2000-0062209 A | 10/2000 |
| KR | 10-2002-0001486 A | 1/2002 |
| KR | 10-0797406 B1 | 1/2008 |
| KR | 10-2011-0087437 | 8/2011 |
| TW | 480783 B | 3/2002 |
| TW | 200842181 A | 11/2008 |
| TW | 201022679 | 6/2010 |
| WO | 2006043631 A1 | 4/2006 |

OTHER PUBLICATIONS

Corresponding application in Japan JP2015-513956, office action dated Jan. 5, 2016.
TW office action dated Jan. 22, 2015, with translation (corresponding application).
International Search Report for PCT/KR2013/005344, ISA/KR, dated Jul. 29, 2013.
Written Opinion of the ISA for PCT/KR2013/005344, ISA/KR, dated Jul. 29, 2013.

* cited by examiner

TEST SOCKET INCLUDING CONDUCTIVE PARTICLES IN WHICH THROUGH-HOLES ARE FORMED AND METHOD FOR MANUFACTURING SAME

CROSS-REFERENCE TO RELATED APPLICATIONS

This application is a 371 U.S. National Stage of International Application No. PCT/KR2013/005344, filed Jun. 18, 2013, which claims priority to Korean Patent Application No. 10-2012-0065229, filed Jun. 18, 2012, the entire disclosures of both of which are incorporated by reference herein in their entirety.

TECHNICAL FIELD

The present invention relates to a test socket with conductive particles each having a through-hole, and more particularly, to a test socket with conductive particles which may reduce deterioration of durability due to frequent contacts with a terminal of a device to be tested, and to a method of fabricating the test socket.

BACKGROUND ART

In general, a test socket is used in a test process to determine whether a fabricated device to be tested is defective. In other words, a predetermined electric test is performed to determine defectiveness of the fabricated device to be tested. In doing so, the test device to be tested and a test apparatus for testing do not directly contact with each other, but are indirectly connected with each other via a test socket. This is because the test apparatus for testing is relatively expensive and thus it is difficult to replace the test apparatus when abraded or damaged due to frequent contacts with the device to be tested and replacement costs are high. Accordingly, the test socket is replaceably provided at an upper side of the test apparatus and the device to be tested contacts the test socket not the test apparatus, thereby electrically connected to the test apparatus. Thus, a test signal output from the test apparatus is transmitted to the device to be tested via the test socket.

Figure 1:
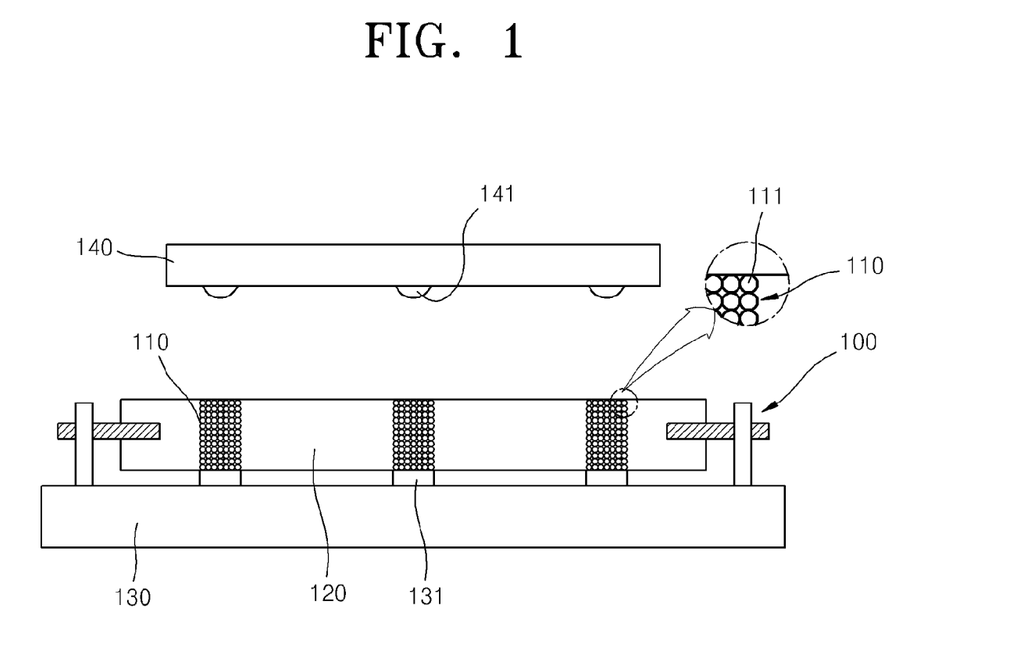
FIG. 1 is a cross-sectional view schematically illustrating a conventional test socket.
Figure 2:
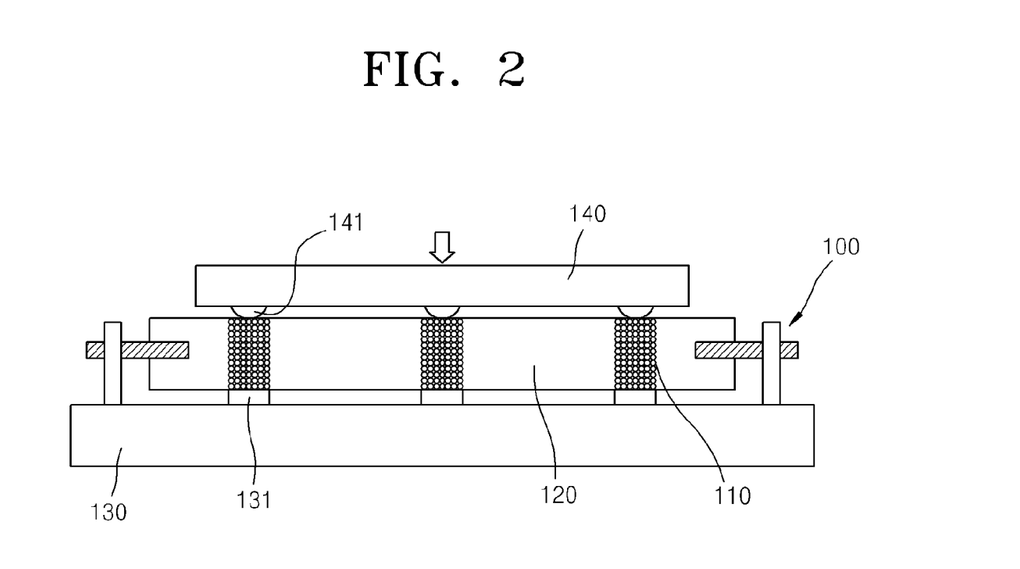
FIG. 2 illustrates the operation of the test socket of FIG. 1.

As illustrated in FIGS. 1 and 2, a test socket 100 is arranged between a device to be tested 140 and a test apparatus 130 to electrically connect a terminal 141 of the device to be tested 140 and a pad 131 of the test apparatus 130 to each other. The test socket 100 includes a plurality of conductive portions 110 and a plurality of insulation support portions 120. The conductive portions 110 are arranged at each position corresponding to the terminal 141 of the device to be tested 140 and have conductivity in a thickwise direction. Each of the conductive portions 110 has a plurality of conductive particles 111 contained in an elastic insulation material.

The insulation support portions 120 support and insulate the conductive portions 110. When the test socket 100 is mounted on the test apparatus 130, the pad 131 of the test apparatus 130 and the conductive portions 110 are in contact with each other and the device to be tested 140 may be configured to contact the conductive portions 110 of the test socket 100.

The device to be tested 140 carried by an insert (not shown) contacts the conductive portions 110 of the test socket 100 and then accommodated on the test socket 100. Then, when the test apparatus applies a predetermined electric signal, the signal is transmitted to the device to be tested via the test socket and thus a predetermined electric test is performed.

As described above, the conductive portions 110 of the test socket 100 are configured as the conductive particles are contained is arranged in the insulation material. The terminal 141 of the device to be tested 140 frequently contacts the conductive portions 110. As such, when the terminal 141 of the device to be tested 140 frequently contacts the conductive portions 110, the conductive distributed in the insulation material may easily escape to the outside. In particular, since the conductive has a ball shape and the ball-shaped conductive may easily escape from the insulation material. Accordingly, when conductive escapes to the outside, overall conductive performance may be deteriorated and thus overall reliability of a test may be affected.

DISCLOSURE OF THE INVENTION

Technical Problem

The present invention provides a test socket in which conductive particles are firmly maintained in a conductive portion, and a method of fabricating the test socket.

Technical Solution

According to an aspect of the present invention, a test socket with conductive particles having a through-hole, the test socket being arranged between a device to be tested and a test apparatus to electrically connect a terminal of the device to be tested and a pad of the test apparatus, includes a plurality of conductive portions arranged at a position corresponding to the terminal of the device to be tested and having conductivity in a thickwise direction, each of the plurality of conductive portions in which conductive particles are contained in an elastic insulation material, and a plurality of insulation support portions supporting and insulating the each of the plurality of conductive portions. Each of the conductive particles is provided with a through-hole that penetrates any one surface and another surface other than the one surface and the elastic insulation material fills the through-hole.

Each of the conductive particles may have a circular disc shape in which the through-hole is formed at a center of the conductive particle.

The through-hole may have a shape of any one of a circular section, a star-like section, or a polygonal section.

At least two through-holes may be provided.

Each of the conductive particles may have a "C" shape.

Each of the conductive particles may include one side portion, the other side portion, and a connection portion connecting the one side portion and the other side portion, circumferential edges of the one side portion and the other side portion protrude from the connecting portion, and the through-hole may be configured to penetrate a center portion of the one side portion and a center portion of the other side portion.

Each of the conductive particles may have a circular disc shape having a through-hole formed at a center of the conductive particle, and an angled edge forming an acute angle may be formed at an outer circumference of the conductive particle.

According to another aspect of the present invention, a method of fabricating the above-described test socket includes preparing a substrate, forming a molding layer on the substrate, providing a space having a shape corresponding to that of each of the conductive particles in the molding layer by removing at least a part of the molding layer, and providing the conductive particles by forming a plating layer in the space.

In the providing of the space, the space may be formed by a photolithography process or an imprinting process.

Advantageous Effects

In the test socket according to the present invention, a through-hole is formed in each of conductive particles arranged in a conductive portion and the through-hole is filled with an insulation material to be integrally formed with a surrounding insulation material. Accordingly, the conductive particles may not easily escape to the outside during a contact process with the terminal of the device to be tested.

BRIEF DESCRIPTION OF THE DRAWINGS

The above and other features and advantages of the present invention will become more apparent by describing in detail exemplary embodiments thereof with reference to the attached drawings in which.

MODE FOR INVENTION

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 3:
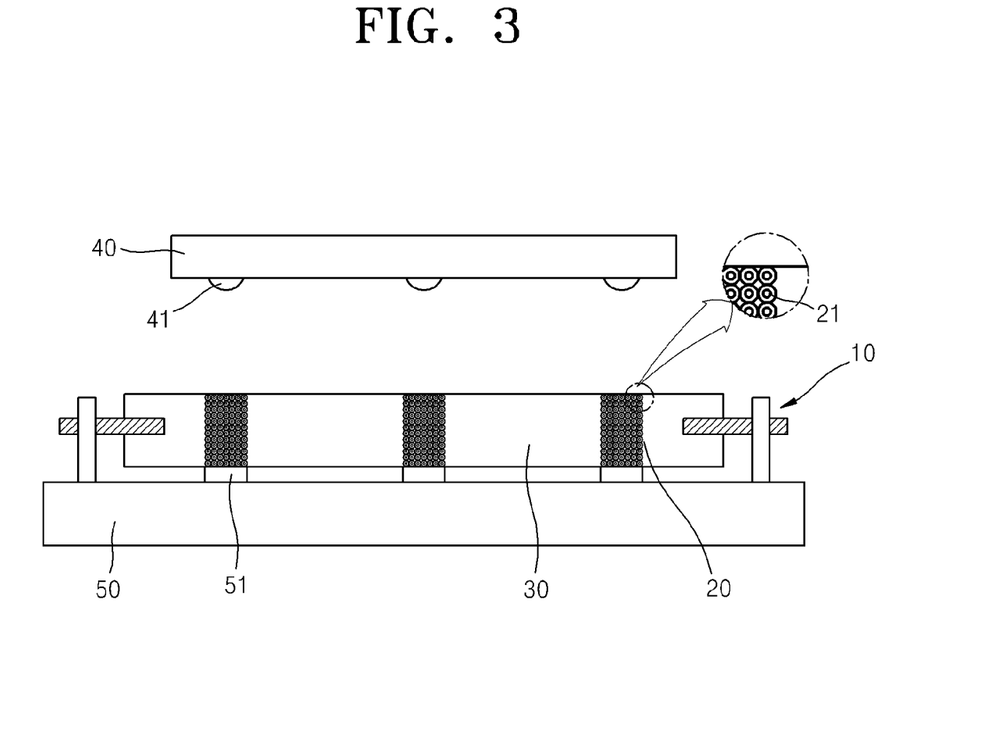
FIG. 3 is a cross-sectional view schematically illustrating a test socket according to an embodiment of the present invention.

FIG. 3 is a cross-sectional view schematically illustrating a test socket according to an embodiment of the present invention. Referring to FIG. 3, a test socket 10 according to the present invention is arranged between a device to be tested 40 and a test apparatus 50 to electrically connect a terminal 41 of the device to be tested 40 and a pad 51 of the test apparatus 50. The test socket 10 includes a conductive portion 20 and an insulation support portion 30.

The conductive portion 20 is provided in multiple numbers at each position corresponding to the terminal 41 of the device to be tested 40 and has conductivity in a thickwise direction and not in a surface direction perpendicular to the thickwise direction. In the conductive portion 20, a plurality of conductive particles 21 are contained in an elastic insulation material.

The elastic insulation material may be a polymer material having a bridging structure. There are many materials to be used for forming a curable polymer material to obtain the elastic material. In detail, conjugated diene-based rubber such as poly butadiene rubber, natural rubber, polyisoprene rubber, styrene-butadiene copolymer rubber, acrylonitrile-butadiene copolymer rubber, etc. and a hydrogen additive thereof, a block copolymer rubber such as styrene-butadiene-diene block copolymer rubber, styrene-isoprene block copolymer, etc. and a hydrogen additive thereof, chloroprene rubber, urethane rubber, polyester-based rubber, epichlorohydrin rubber, silicone rubber, ethylene-propylene copolymer rubber, ethylene-propylene-diene copolymer rubber, etc. may be used therefor.

In the above descriptions, when a weather resistance feature is required for the conductive portion 20 that is obtained, a material other than the conjugated diene-based rubber, in particular, silicone rubber in terms of plastic processability and electric characteristics may be used.

Silicone rubber may be obtained by bridging or condensing liquid silicone rubber. The liquid silicone rubber may have a viscosity of 105 poises or lower at a deformation speed of 10-1 second and may be any one of a condensation type, an additive type, and one containing a vinyl radical or hydroxyl radical. In detail, the liquid silicone rubber may be dimethyl silicon crude rubber, methyl vinyl silicon crude rubber, vinyl silicon methylphenyl crude rubber, etc.

Conductive particles having magnetism are used as the conductive particles 21. As a detailed example of the conductive particles 21, there are particles of a metal having magnetism, such as iron, cobalt, or nickel, particles of an alloy thereof, or particles containing the metal, or particles by using these particles as core particles, a surface of the core particles being plated with metal having superior conductivity such as gold, silver, palladium, or rhodium, or particles using nonmagnetic metal particles, inorganic material particles such as glass bead, or polymer particles, as core particles, a surface of the core particles being plated with conductive magnetic metal such as nickel or cobalt.

Among the above particles, one using nickel as core, a surface of the core being plated with gold having superior conductivity, may be used.

Figure 4:
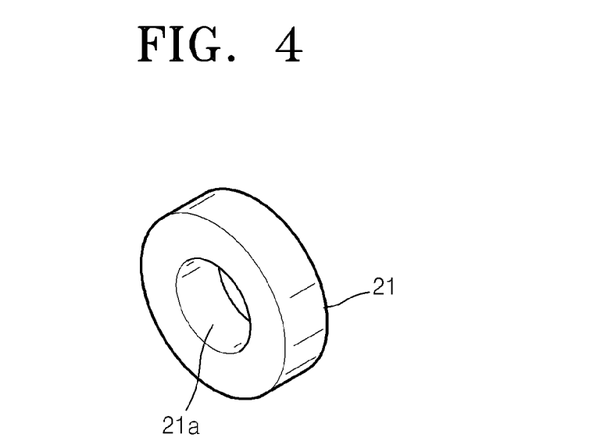
FIG. 4 is a perspective view illustrating an example of conductive particles in the test socket of FIG. 3.

A through-hole 21a is provided in each of the conductive particles 21 to penetrate any one surface thereof and a surface other than the one surface. The through-hole 21a is filled with the elastic insulation material so that the conductive particles 21 may be integrally coupled to the insulation material. In other words, as the conductive particles 21 are integrally coupled to the elastic insulation material, the conductive particles 21 may be firmly arranged in the elastic insulation material. Each of the conductive particles 21 basically has a disc shape, as illustrated in FIG. 4, in which the through-hole 21a can penetrate the center of one surface and the center of the other surface. The through-hole 21a may have a roughly circular section.

The insulation support portion 30 supports the conductive portion 20 and simultaneously insulates the conductive portion 20 to prevent electricity from flowing between the conductive portions 20. The insulation support portion 30 may be formed of the same material as the elastic insulation material. In detail, silicone rubber may be used for the insulation support portion 30.

A method of fabricating conductive particles in the above-described test socket according to the present invention will be described below with reference to FIGS. 5A through 5D.

Figure 5:
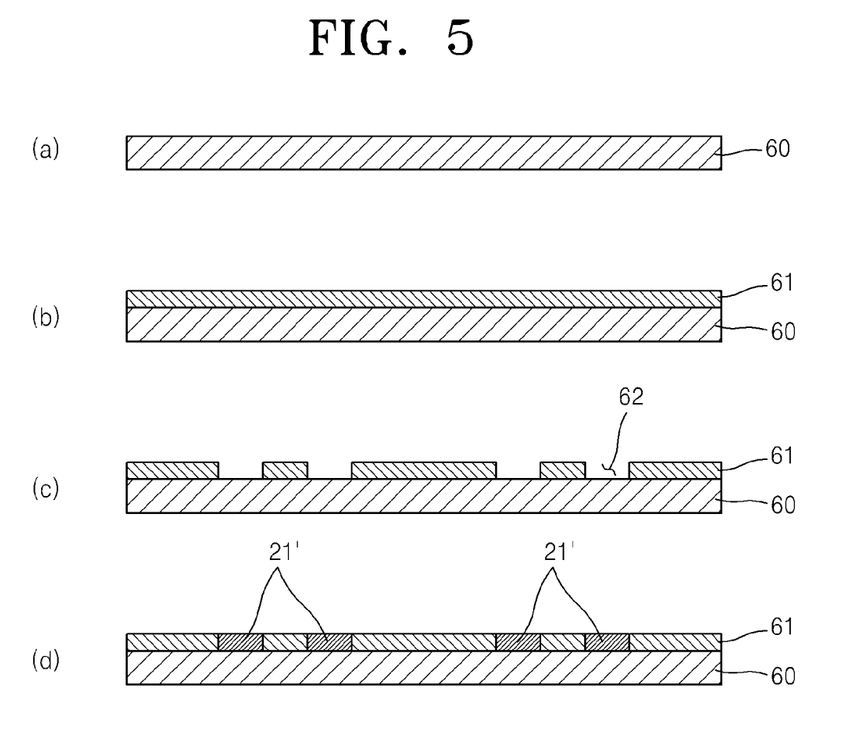
FIGS. 5A through 5D illustrate an example of a method of fabricating the conductive particles of FIG. 4.

First, referring to FIG. 5A, a substrate 60 is prepared. As illustrated in FIG. 5B, a molding layer 61 is arranged on the substrate 60. A silicone rubber material may be used for the molding layer 61, but the present invention is not limited thereto. Then, as illustrated in FIG. 5C, a space 62 having a shape corresponding to the shape of each conductive particle is formed by removing at least a part of the molding layer 61. In detail, the molding layer 61 is formed in a predetermined space by a photolithography process using masking, ultraviolet (UV) irradiation, etching, etc., or by an imprinting process for forming a predetermined space by pressing the molding layer 61 using a mold embossed with a desired pattern. Then, as illustrated in FIG. 5D, the conductive particle is provided by forming a plating layer 21' in the space 62.

Although it is not illustrated, when the conductive particles are prepared, a liquid molding material is fabricated by injecting the conductive particles into liquid silicone rubber. Then, the liquid molding material is inserted into a mold (not shown) having a predetermined shape and a magnetic field is applied to each position where a conductive portion is to be formed, to cure the liquid molding material. Accordingly, fabrication of a test socket is completed. Since the fabrication process that is not illustrated is already well-known technology, a detailed description is omitted herein.

The test socket according to an embodiment of the present invention has the following operations and effects.

First, after a test socket is accommodated on a test apparatus, a device to be tested is accommodated on the test socket. A conductive portion of the test socket that is pressed by a terminal of the device to be tested is in a state of being electrically conductive. As the test apparatus applies a predetermined electric signal, the electric signal is transmitted to the terminal of the device to be tested via the conductive portion and thus a predetermined test may be performed.

In the test socket according to the present embodiment, a through-hole is formed in each of the conductive particles and an elastic insulation material forming the conductive portion is inserted through the through-hole. As the conductive particles are integrally formed with the elastic insulation material, even when the terminal of the device to be tested frequently contacts the conductive portion, each of the conductive particles may escape less from the conductive portion. Accordingly, since the conductive particles may be continuously maintained in the conductive portion, conductivity of the conductive portion is not deteriorated in spite of a long-time use thereof and reliability of an overall test may be maintained.

The test socket according to the present embodiment may be deformed as follows. First, although in the above description, each of the conductive particles has a circular disc shape having a through-hole at the center thereof, the present invention is not limited thereto.

Figure 6:
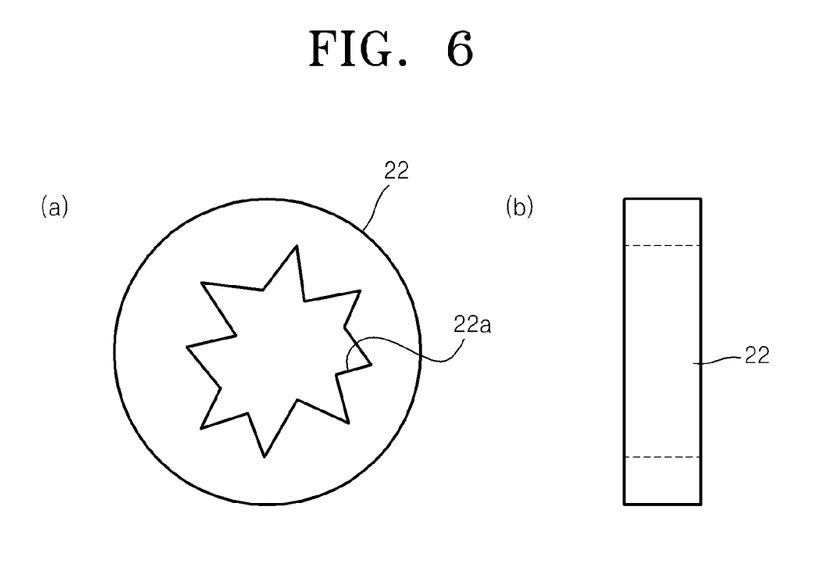
FIGS. 6A, 6B, 7A, 7B, 8A, 8B, 9A, 9B, 10A, 10B, 11 and 12 illustrate other examples of the conductive particles according to other embodiments of the present invention.

For example, as illustrated in FIGS. 6A and 6B, a conductive particle 22 basically having a circular disc shape may have a through-hole 22a having a star-shaped section shape. Alternatively, a through-hole having polygonal sectional shape may be available. As the through-hole has a star-shaped sectional shape, a close contact force with respect to the insulation material may be further improved.

Figure 7:
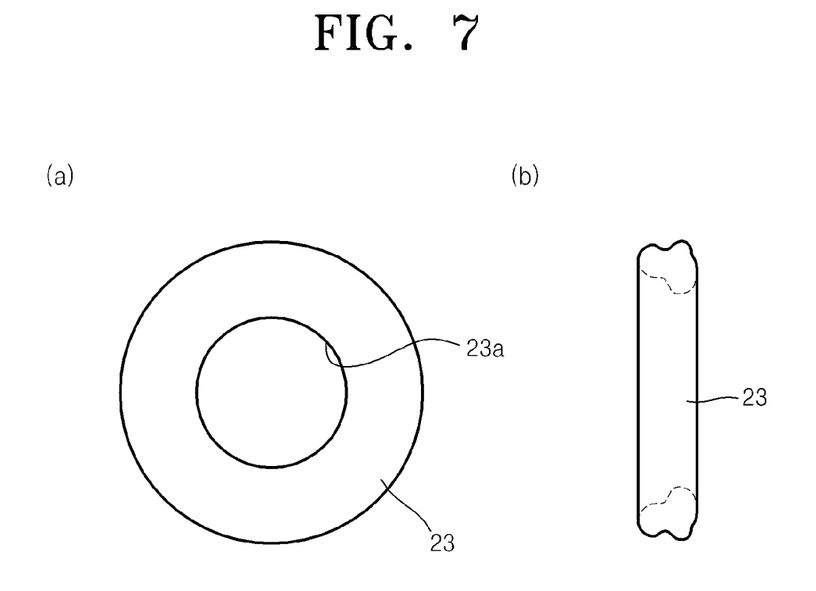

Also, as illustrated in FIGS. 7A and 7B, a conductive particle 23 has a largely circular disc shape while having an irregular section. As such, when a through-hole 23a is formed to be rather irregular on a surface thereof, a surrounding elastic material may be firmly fixed.

Figure 8:
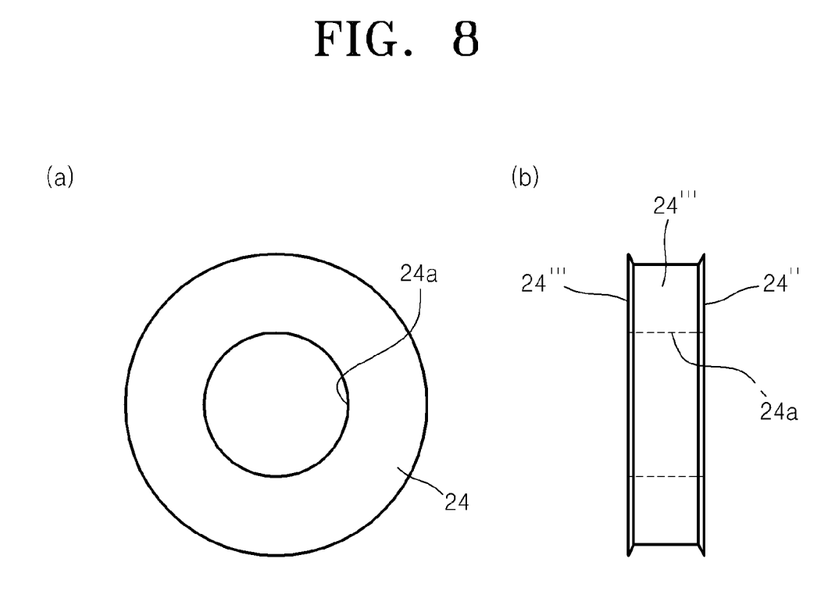

Also, as illustrated in FIGS. 8A and 8B, when a conductive particle 24 has a circular disc shape, a rim having an acute angle may be formed at an outer circumference of the conductive particle 24. For example, the conductive particle 24 includes one side portion 24', the other side portion 24", and a connection portion 24''' connecting the one side portion 24' and the other side portion 24". The circumferential edges of the one side portion 24' and the other side portion 24" protrude from the connecting portion 24'''. A through-hole 24a may be configured to penetrate a center portion of the one side portion 24' and a center portion of the other side portion 24". When an edge having an acute angle is formed, a contact pressure occurring when the terminal of the device to be tested and the conductive particles contact with each other is increased so that the contact therebetween may be stably maintained.

Figure 9:
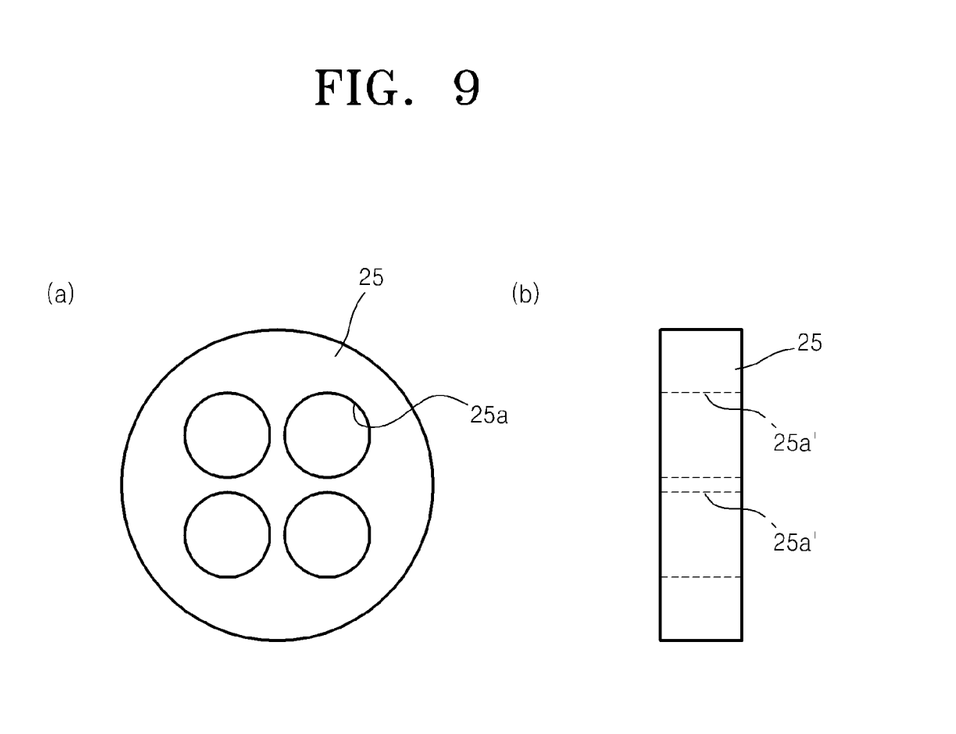

As illustrated in FIGS. 9A and 9B, a plurality of through-holes 25a may be formed in a conductive particle 25. For example, four through-holes may be formed. As such, when a plurality of through-holes are formed, a contact surface with the elastic insulation material is increased so that a generally stable combination between the conductive particle 25 and the elastic insulation material may be possible.

Figure 10:
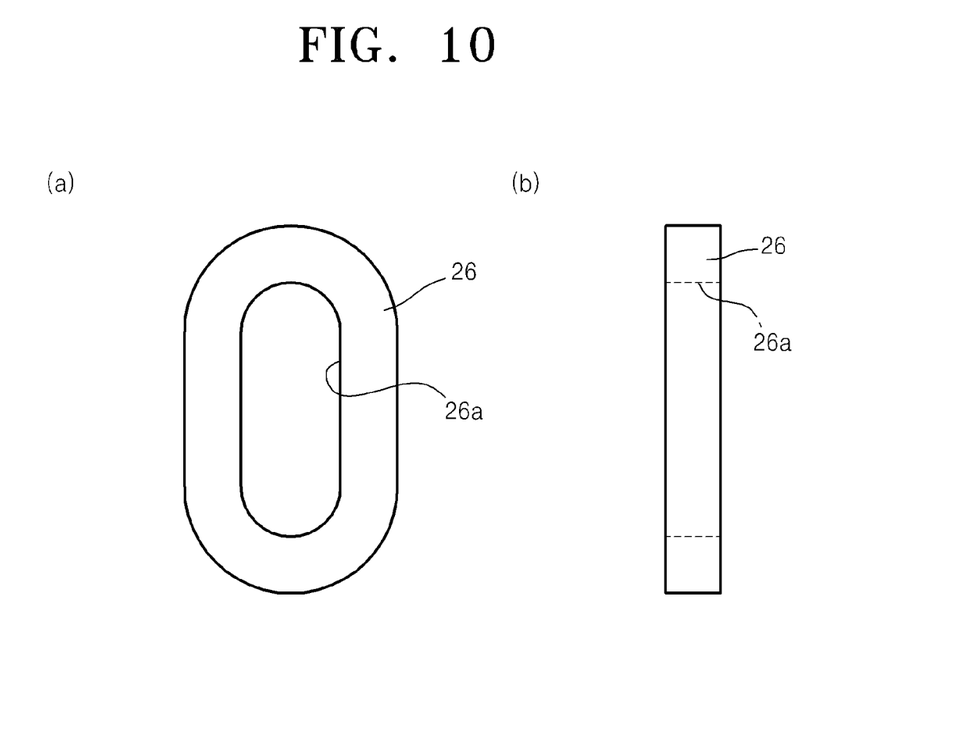

As illustrated in FIGS. 10A and 10B, a conductive particle 26 may have a shape of an elongated disc extending in one direction, not a circular disc shape, and a through-hole 26a is formed therein corresponding to the shape. The elongated disc shape has a merit that mechanical adhesion strength may be increased.

Figure 11:
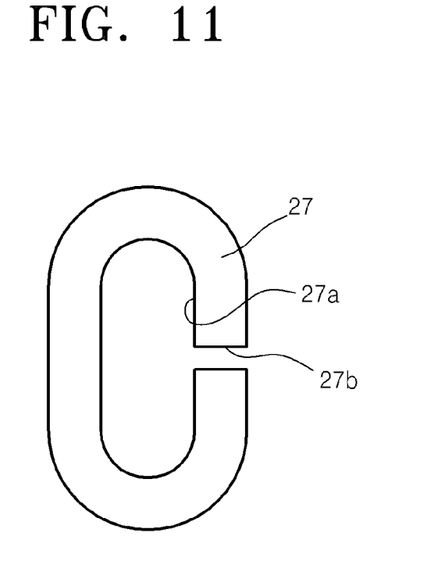
Figure 12:
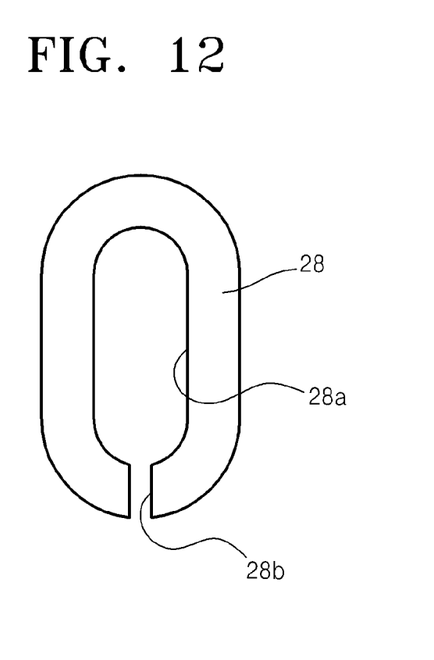

As illustrated in FIGS. 11 and 12, conductive particles 27 and 28 each may have a "C" shape. For example, in the shape of a disc having a through-hole 27a or 28a, a connection hole 27b or 28b for connecting a part of a ring portion and the through-hole 27a or 28a may be further formed. In the case of a partially open ring shape, mechanical adhesion strength with the elastic insulation material is increased and a large amount of an elastic force may be absorbed in a contact process with the terminal of the device to be tested.

While this invention has been particularly shown and described with reference to exemplary embodiments thereof, it will be understood by those skilled in the art that various changes in form and details may be made therein without departing from the spirit and scope of the invention as defined by the appended claims.

The invention claimed is:

1. A test socket with conductive particles having a through-hole, the test socket being arranged between a device to be tested and a test apparatus to electrically connect a terminal of the device to be tested and a pad of the test apparatus, the test socket comprising:
    a plurality of conductive portions arranged at a position corresponding to the terminal of the device to be tested and having conductivity in a thickwise direction, each plurality of conductive portions having conductive particles which are contained in an elastic insulation material; and
    a plurality of insulation support portions supporting and insulating each of the plurality of conductive portions,
    wherein each of the conductive particles is provided with a through-hole that penetrates any one surface and another surface other than the one surface and the elastic insulation material fills the through-hole, such that the elastic insulation material connects an inside and outside of the through-hole.

2. The test socket of claim 1, wherein each of the conductive particles has a circular disc shape in which the through-hole is formed at a center of the conductive particle.

3. The test socket of claim 2, wherein the through-hole has a shape of any one of a circular section, a star-like section, or a polygonal section.

4. The test socket of claim 1, wherein at least two through-holes are provided.

5. The test socket of claim 1, wherein each of the conductive particles has a "C" shape.

6. The test socket of claim 1, wherein each of the conductive particles comprises one side portion, the other side portion, and a connection portion connecting the one side portion and the other side portion, circumferential edges of the one side portion and the other side portion protrude from the connecting portion, and the through-hole is configured to penetrate a center portion of the one side portion and a center portion of the other side portion.

7. The test socket of claim 1, wherein each of the conductive particles has a circular disc shape having a through-hole formed at a center of the conductive particle, and an angled edge forming an acute angle is formed at an outer circumference of the conductive particle.

8. A method of fabricating the test socket according to claim 1, the method comprising:
- preparing a substrate;
- forming a molding layer on the substrate;
- providing a space having a shape corresponding to that of each of the conductive particles in the molding layer by removing at least a part of the molding layer; and
- providing the conductive particles by forming a plating layer in the space.

9. The method of claim 8, wherein, in the providing of the space, the space is formed by a photolithography process or an imprinting process.

\* \* \* \* \*